(12) United States Patent
Tartaglia et al.

(10) Patent No.: US 10,965,084 B1
(45) Date of Patent: Mar. 30, 2021

(54) SYSTEMS AND METHODS FOR PLANAR WAVEGUIDE MOUNTING AND COOLING

(71) Applicant: Lockheed Martin Corporation, Bethesda, MD (US)

(72) Inventors: Michael L. Tartaglia, Louisville, CO (US); Jesse William Fisher, Boulder, CO (US); Andrew Jonathan Gleason, Arvada, CO (US); Ezra Takara, Sunnyvale, CA (US); Joel R. Blum, Erie, CO (US); Luke L. Wieczorek, Erie, CO (US); Ross Hartman, Cortez, CO (US); Samuel David Field, Longmont, CO (US); Zachary William Prezkuta, Lafayette, CO (US); Robert Andrew Sims, Lafayette, CO (US); Micah Boyd, Niwot, CO (US)

(73) Assignee: LOCKHEED MARTIN CORPORATION, Bethesda, MD (US)

(*) Notice: Subject to any disclaimer, the term of this patent is extended or adjusted under 35 U.S.C. 154(b) by 0 days.

(21) Appl. No.: 16/405,905

(22) Filed: May 7, 2019

(51) Int. Cl.
| | | |
|---|---|---|
| *H01S 3/03* | (2006.01) | |
| *H01S 3/10* | (2006.01) | |
| *H01S 3/04* | (2006.01) | |
| *H01S 3/06* | (2006.01) | |
| *H01S 5/20* | (2006.01) | |
| *H01S 5/024* | (2006.01) | |
| *H01S 3/16* | (2006.01) | |

(52) U.S. Cl.
CPC .......... *H01S 3/0315* (2013.01); *H01S 3/0401* (2013.01); *H01S 3/0602* (2013.01); *H01S 3/10007* (2013.01); *H01S 3/1643* (2013.01); *H01S 5/02469* (2013.01); *H01S 5/02492* (2013.01); *H01S 5/2018* (2013.01)

(58) Field of Classification Search
CPC .. H01S 3/0315; H01S 3/1643; H01S 3/10007; H01S 3/0401; H01S 3/0602; H01S 5/02492; H01S 5/02469; H01S 5/2018
See application file for complete search history.

(56) References Cited

U.S. PATENT DOCUMENTS

| | | | | |
|---|---|---|---|---|
| 6,307,871 | B1 * | 10/2001 | Heberle | .................. F28D 20/02 372/34 |
| 2008/0017975 | A1 * | 1/2008 | Deppisch | ................ H01L 23/42 257/706 |
| 2016/0141825 | A1 * | 5/2016 | Klennert | ............. H01S 5/02469 372/34 |

* cited by examiner

Primary Examiner — Yuanda Zhang
(74) Attorney, Agent, or Firm — Morgan, Lewis & Bockius LLP

(57) ABSTRACT

A planar waveguide laser crystal assembly includes an optical bench and a laser crystal mount mounted on the optical bench. The laser crystal mount includes an upper housing having an interior horizontal surface and an exterior horizontal, a lower housing coupled to the upper housing and having an interior horizontal surface and an exterior horizontal surface, and a cavity defined between the interior horizontal surfaces of the upper and lower housings. A laser crystal is mounted in the cavity of the laser crystal mount. Each of the exterior horizontal surfaces of the upper and lower housings is oriented parallel to a length of the laser crystal. The laser crystal assembly further includes a heat dissipating structure thermally coupled to at least one of the exterior horizontal surfaces of the upper and lower housings to dissipate heat transferred from the laser crystal mount.

19 Claims, 7 Drawing Sheets

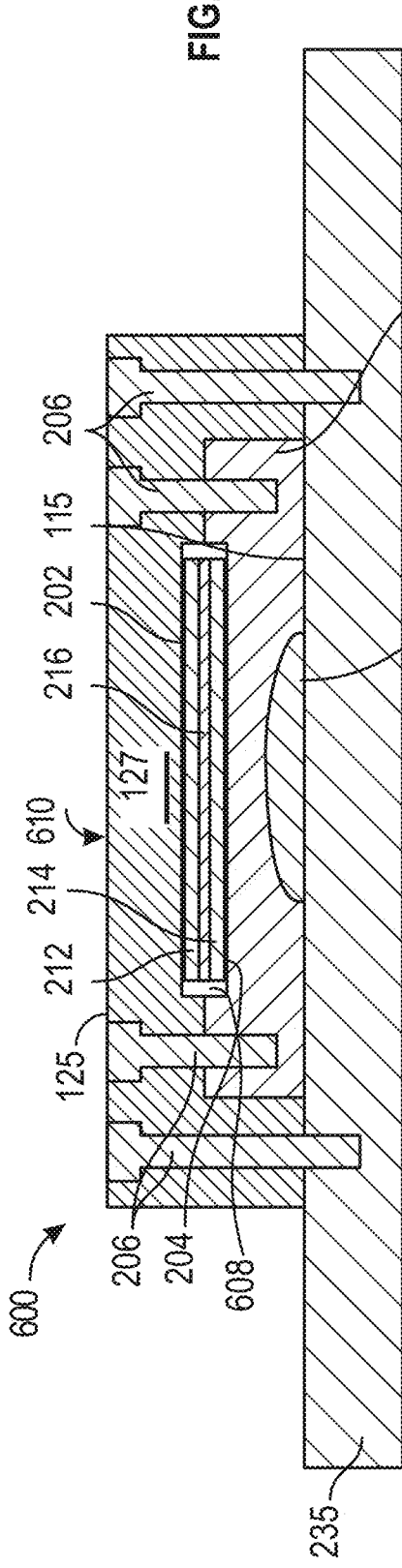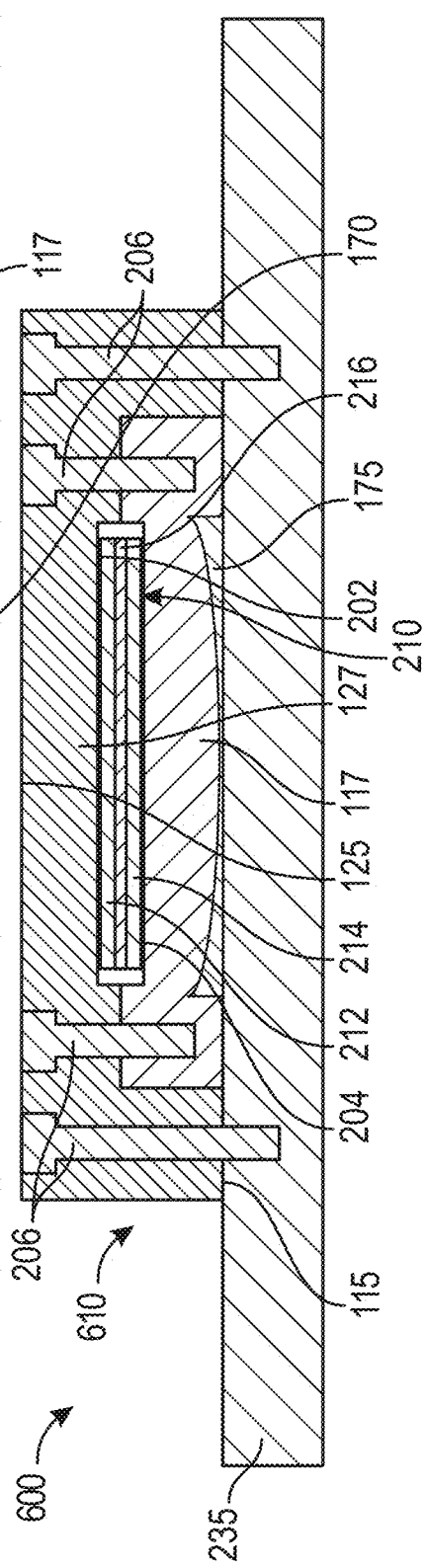

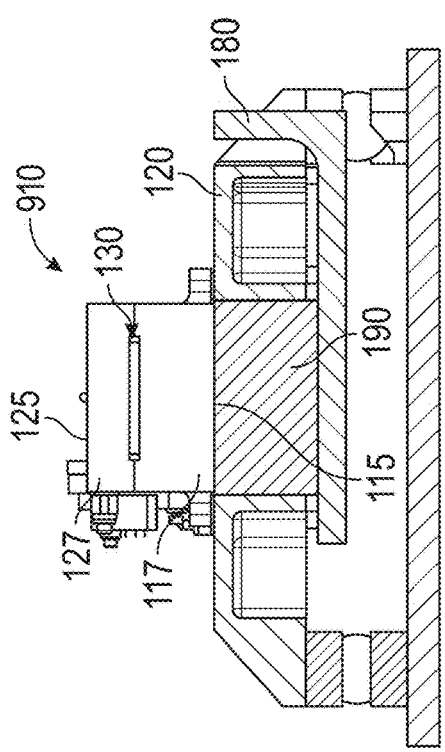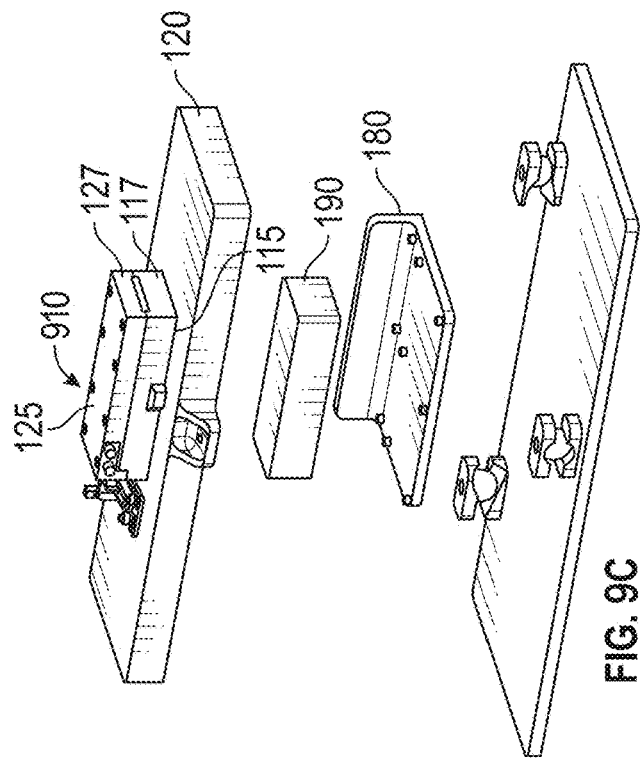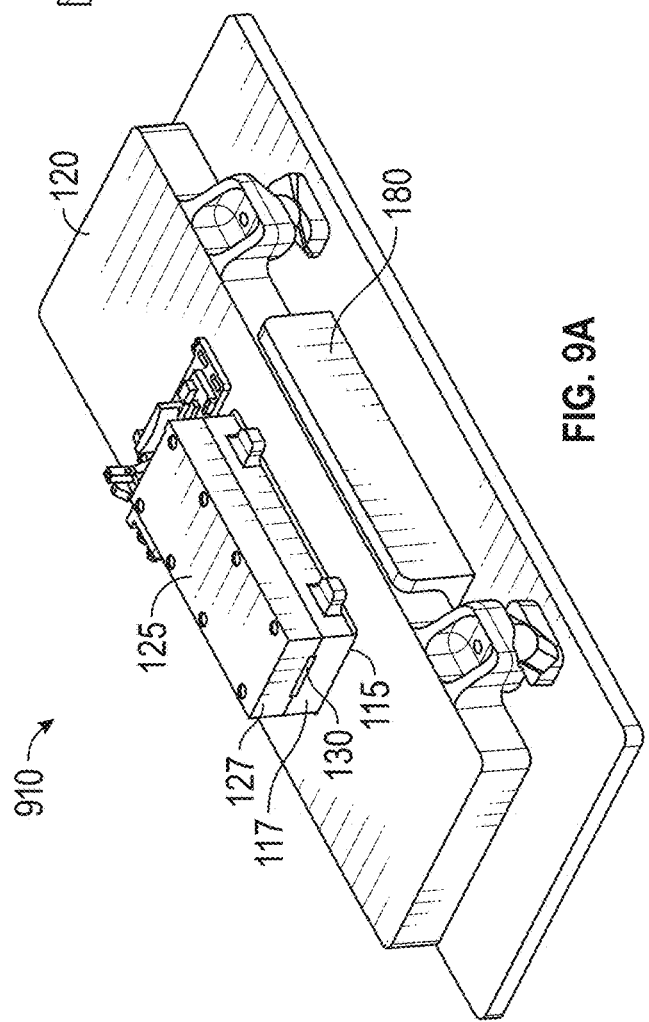

SYSTEMS AND METHODS FOR PLANAR WAVEGUIDE MOUNTING AND COOLING

STATEMENT REGARDING FEDERALLY SPONSORED RESEARCH OR DEVELOPMENT

Not Applicable.

TECHNICAL FIELD

The present disclosure relates generally to mechanical mounts and methods of mechanical mounting, and in particular, to methods and apparatus for mounting optical components, such as planar waveguide (PWG) lasers and amplifiers, in a manner that controls stress development and that also permits high heat flow from the components.

BACKGROUND

High power lasers and laser amplifiers having very high beam quality are difficult to make because a number of factors degrade performance. One such factor is heat deposition within the laser material resulting from imperfect conversion of pump radiation input power into laser output power. Most frequently it is not absolute temperature rise that is of concern but, instead, spatial gradients within the material. It is well known that parameters, such as the refractive index, are temperature dependent, and consequently temperature gradients lead to refractive index gradients, which in turn degrade the performance of the laser or amplifier. Heat loads and poor mechanical mounting techniques also cause stresses in the materials that degrade performance by introducing wavefront distortions.

In an attempt to address problems associated with stresses generated during mounting, considerable efforts have been expended within the laser industry in finding ways to mount laser rods and slabs that optimize optical performance. Compounding the problem, often a relatively large amount of heat must be removed from the material during mounting, and as a result, implemented mounting techniques typically should provide a good heat conduction path to a heat sink or cold plate where the heat is removed through convection, conduction, or radiation. A further complication is that laser radiation must be extracted from the rod or slab through apertures and at least some of the laser material must be exposed to permit pump light to enter the material for absorption.

A number of techniques have been conceived to mount round laser rods, and these techniques are aimed at permitting good heat flow and at addressing stress production. Common to all these techniques is the assumption of round laser rods. Such circular geometries are attractive in part because of the ease of fabrication, but, unfortunately, these mounting techniques are not particularly well suited for slabs having a rectangular shape (or not being round in cross section).

Slab geometries are attractive for several reasons and are particularly useful in the generation of high optical output powers. First, they provide at least one rectangular flat surface through which pump light can enter. Second, with uniform pumping, slab geometries promote one-dimensional temperature gradients. Third, they provide a method to "zig-zag" a laser beam within the medium. The latter provides for a way to extract energy efficiently with good beam quality. In order to maximize the advantages inherent in such slab geometry, it is, however, important to design the mounting and cooling arrangements very carefully.

Some efforts have been made in the laser industry to address some of the challenges associated with mounting of slab geometries. For example, a number of prior disclosures describe methods of mounting slabs that incorporate a gas or liquid flow channel between the source of pump radiation and the slab. These methods or approaches have several drawbacks and do not adequately meet the needs of the laser industry. First, these methods assume the presence of a flowing cooling liquid and, therefore, preclude operating with a passive heat disposing mechanism. Second, these methods are often susceptible to the depositing of unwanted contaminants on the surface of the slab that may degrade the performance of the laser.

A somewhat more attractive solution may involve an arrangement in which passive heat spreaders and radiators are used without flowing coolants, such as cooling gas or liquid, being provided as an intrinsic part of the construction. For example, some prior art references discloses a method to sandwich a slab between transparent conductive heat sinks which also act as guides to transport pump light to the slab. However, the described method fails to solve the problem of removing large amounts of heat from the assembly. Also, the method includes bonding the slab to the conductive heat sinks, which does not work well at high thermal loads since it promotes stresses within the laser slab.

Self-Imaging Planar Waveguide (PWG) Lasers and Laser Amplifiers are used for various applications, including systems that require high laser output power, good optical beam quality, hermetic enclosures for high reliability, and excellent SWaPT (Size, Weight and Power, Thermal) characteristics. The optical pumping methods used with these laser systems result in heat being deposited into the laser crystals that can lead to thermo-optical aberrations, and high stress mounting of the laser crystals can lead to unwanted optical aberrations by way of strain birefringence effects. Left unmanaged, these aberrations reduce overall laser system efficiency and reduce laser output beam quality.

It is therefore desirable to develop methods to hold PWG laser crystals with low stress, but with mechanically adequate means for the environmental and system requirements. It is also necessary to provide thermal management pathways that uniformly and quickly dissipate heat so that minimal thermal defects are imprinted into the laser crystals from the downstream cooling system or from the optical pumping method. The cooling system also serves to reduce the magnitude of residual thermal aberrations and minimize the thermal transient timelines required to stabilize the laser outputs.

SUMMARY

In accordance with various embodiments of the present disclosure, a planar waveguide laser crystal assembly includes an optical bench for mounting at least one optical element, and a laser crystal mount mounted on the optical bench. The laser crystal mount includes an upper housing having an interior horizontal surface and an exterior horizontal surface opposite the interior horizontal surface, a lower housing coupled to the upper housing, the lower housing having an interior horizontal surface and an exterior horizontal surface opposite the interior horizontal surface, and a cavity defined between the interior horizontal surfaces of the upper and lower housings. The planar waveguide laser crystal assembly further includes a laser crystal mounted in the cavity of the crystal mount. The laser crystal includes upper and lower cladding layers and a waveguide layer interposed between the upper and lower cladding layers.

Each of the exterior horizontal surfaces of the upper and lower housings are oriented parallel to a length of the laser crystal. The planar waveguide laser crystal assembly further includes a heat dissipating structure thermally coupled to the exterior horizontal surface of at least one of the upper and lower housings to uniformly and quickly dissipate heat from the crystal mount.

In accordance with various embodiments of the present disclosure, a method of mounting a planar waveguide laser crystal includes providing a crystal mount comprising an upper housing, a lower housing coupled to the upper housing, and a cavity interposed therebetween, the cavity defined by at least a portion of interior horizontal surfaces of the upper and lower housings positioned opposite and facing each other, and positioning a thermal interface material on the interior horizontal surfaces of the upper and lower housings defining the cavity. The method further includes mounting the planar waveguide laser crystal in the cavity, and thermally coupling a heat dissipating structure to a horizontal exterior surface of at least one of the upper and lower housings to uniformly and quickly dissipate heat from the laser crystal mount. The laser crystal includes upper and lower cladding layers and a waveguide layer interposed therebetween, and the mounting includes positioning the laser crystal in the cavity with the upper and lower cladding layers sandwiched between respective interior horizontal surfaces of the upper and lower housings.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

FIG. 7A is a cross-sectional view of an exemplary laser crystal assembly having a bottom-mounted heat dissipating structure with thermal choke and optical bench-embedded heat pipes, in accordance with some embodiments of the present disclosure.

FIG. 7B is a cross-sectional view of an exemplary laser crystal assembly having a bottom-mounted heat dissipating structure with thermal choke and optical bench-embedded heat pipes, in accordance with some embodiments of the present disclosure.

FIG. 9A is an isometric view of an exemplary laser crystal assembly having a bottom-mounted heat dissipating structure including a vapor chamber and flat oscillating heat pipes, in accordance with some embodiments of the present disclosure.

FIG. 9B is side cross-sectional view of the exemplary laser crystal assembly of FIG. 9A, in accordance with some embodiments of the present disclosure.

FIG. 9C is an exploded isometric view of the exemplary laser crystal assembly of FIG. 9A, in accordance with some embodiments of the present disclosure.

DETAILED DESCRIPTION

Figure 1:
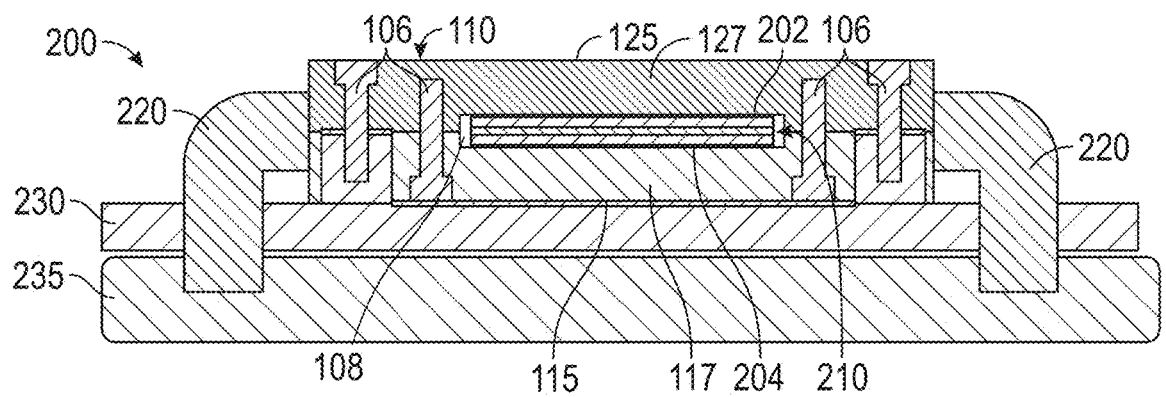
FIG. 1 is a cross-sectional view of a laser crystal assembly having a side-mounted heat dissipating structure with non-embedded heat pipes.

The detailed description set forth below describes various configurations of the subject technology and is not intended to represent the only configurations in which the subject technology may be practiced. The detailed description includes specific details for the purpose of providing a thorough understanding of the subject technology. Accordingly, dimensions may be provided in regard to certain aspects as non-limiting examples. However, it will be apparent to those skilled in the art that the subject technology may be practiced without these specific details. In some instances, well-known structures and components are shown in block diagram form in order to avoid obscuring the concepts of the subject technology.

It is to be understood that the present disclosure includes examples of the subject technology and does not limit the scope of the appended claims. Various aspects of the subject technology will now be disclosed according to particular but non-limiting examples. Various embodiments described in the present disclosure may be carried out in different ways and variations, and in accordance with a desired application or implementation.

The present disclosure provides a Planar Waveguide (PWG) laser crystal assembly, mounting apparatus, and corresponding mounting processes that satisfy the mechanical and thermal requirements of PWG laser crystals, while finding an optimized solution for multiple laser system packaging challenges. In accordance with various embodiments of the present disclosure, the PWG laser crystal mounting apparatus is designed to hold and protect the PWG laser crystal with a low stress compression stackup of thermal interface material between the two broad cladding faces of the PWG laser crystal and the two corresponding interior thermal interfaces of the two-piece laser crystal mount.

In some embodiments, the laser crystal mount material is Coefficient of Thermal Expansion (CTE) matched to the laser crystal CTE, and generally has natively high thermal conductivity. In embodiments where the CTE is matched very closely, indium or indium-silver foil gaskets may be utilized as the thermal interface material between outer cladding layers of the laser crystal and inner surfaces of the laser crystal mount. In the case of glass-based PWG laser crystal cladding materials (e.g., Magnesium Fluoride clad PWGs, MFG.) Copper Molybdenum (CuMo) and Cupper Tungsten (CuW) alloys can be engineered to closely match the "perpendicular to c-axis" and the "parallel to c-axis" CTE ranges depending on mounting orientation. In cases where the laser cladding material exhibits a large CTE range compliant thermal gap pad gasket material can be used. These CuMo and CuW alloys have very good bulk thermal conductivity, and are also compatible with the necessary machining and plating methods required by the laser system.

In accordance with some embodiments, a thermal interface material may be used positioned between the PWG laser crystals and the interior thermal interfaces of the crystal laser mount for secure and stress-free mounting of the PWG laser crystal in the crystal mount. Where indium or indium-silver foil gaskets are used as the thermal interface material between the PWG laser crystals and the interior thermal interfaces of the crystal laser mount, the indium or indium-silver foil can be integrated using a hot-press/oven-annealing method, or with a liquid indium reflow or liquid indium-silver reflow method. Accordingly, the methods of mounting the PWG laser crystals as described according to various embodiments herein yield the advantage of a configuration of a low-stress mounting of the PWG laser crystal in the laser crystal mount.

In accordance with some embodiments, the PWG laser crystal mount components may either be solid bulk material or may include embedded vapor-chambers, heat pipes (e.g., oscillating heat pipes) or advanced heat spreaders to augment thermal transport rates. The aforementioned configuration may be advantageous in evenly cooling the PWG laser crystal, and preventing or reducing thermal imprinting, improving overall system thermal transient performance, and/or reducing laser crystal mount mass.

Figure 2:
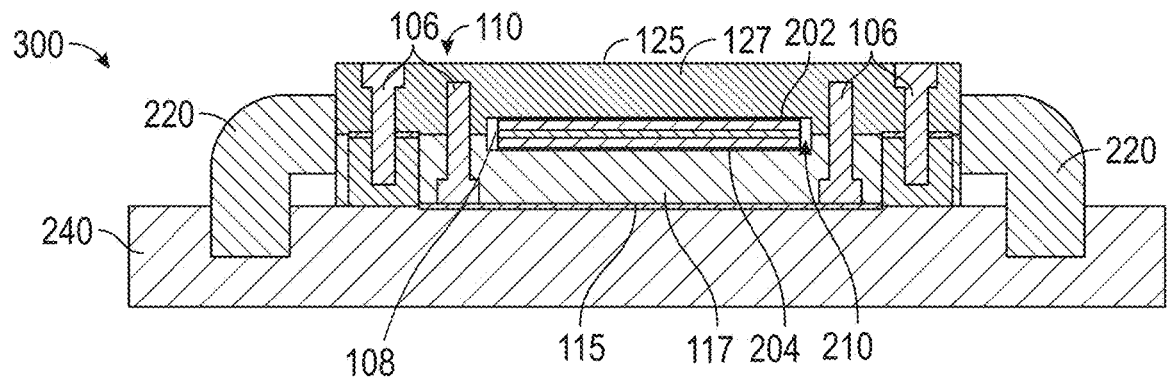
FIG. 2 is a cross-sectional view of a laser crystal assembly having a side-mounted heat dissipating structure with heat pipes embedded into the optical bench.

The PWG laser crystal assemblies of the various embodiments described herein yield several advantages over existing or prior art PWG laser crystal mounting assemblies which traditionally utilize pumped water or waterglycol cooled (Gemini, GSK, Wander, Prowler, ROSSA) with an external pump/chiller system. In these cases, liquid coolant fittings are integrated into top and bottom crystal mount components, and liquid coolant channels are drilled along the optical length of the PWG laser crystal or across the unguided dimension of the laser crystals. This approach provides an adequate solution for some applications, but is not acceptable for many fielded applications. For applications where water cooling is not viable, heat is traditionally removed from the laser crystal mount from edge mounted heat pipes running parallel to the PWG length and parallel to the PWG unguided dimension (as illustrated in FIGS. 1 and 2). This resulted in asymmetric heat pathways that induced unacceptable laser beam steering (from unmanaged thermal gradients) and other thermally induced optical aberrations. Further, the aforementioned PWG laser crystal mounts that utilize hot-press indium or indium-silver thermal interface method have been demonstrated including thermal choke features in order to counteract the unwanted thermal asymmetry. In these laser crystal mount configurations, the thermal choke features are traditionally prescribed and integrated into the halves of the laser crystal mount to reduce the beam steering magnitude, however the thermal choke features are not capable of fully managing the asymmetry issues, and come at the cost of additional thermal imprinting and stress in the laser crystals that further degrades laser beam quality and laser efficiency.

The planar waveguide laser crystal assemblies of the various embodiments described herein are provided to overcome the shortcomings of the prior art laser crystal assemblies described above. In particular, the PWG laser crystal mounting methods and assemblies of the various embodiments of the present disclosure may be used for application where water cooling is not an acceptable form of heat dissipation. The power required to circulate working fluid with pumps in conventional PWG laser crystal mounting assemblies reduces total system efficiency, and pumps reduce system reliability, introduce vibrations, and limit overall system lifetime. In addition, with the conventional PWG laser crystal mounting assemblies, customer requirements often dictate more sophisticated passive methods be utilized such as heat pipes or thermal straps connecting the laser system to a prescribed thermal plane (as illustrated in FIGS. 1 and 2).

FIG. 1 is a cross-sectional view of a prior art laser crystal assembly 200 having a side-mounted heat dissipating structure with non-embedded heat pipes. FIG. 2 is a cross-sectional view of a prior art laser crystal assembly 300 having a side-mounted heat dissipating structure with heat pipes embedded into the optical bench. In accordance with various embodiments, the laser crystal assemblies 200 and 300 may each include an upper housing 127 and a lower housing 117. The upper and lower housings 127 and 117 may be coupled to each other using a coupling mechanism, e.g., a plurality of fasteners 106. The fasteners 106 may be integrated into the laser crystal mounts 110 for mounting the laser crystal mounts to the respective optical benches 230 and 240. As depicted, the upper housing 127 may have an interior horizontal surface 202 and an exterior horizontal surface 125 opposite the interior horizontal surface. Similar to the upper housing, the lower housing 117 may have an interior horizontal surface 204 and an exterior horizontal surface 115 opposite the interior horizontal surface. The interior horizontal surfaces 202 and 204 of the upper and lower housings 127 and 117 may each include a depression or recess defined by an absence of material at least partially along the respective lengths of the interior horizontal surfaces 202 and 204 of the upper and lower housings 127 and 117. The depressions or recesses of the interior horizontal surfaces 202 and 204 may be positioned opposite to and mirroring each other so as to define a cavity 108 between the upper and lower housings 127 and 117. As depicted, the cavity 108 extends at least partially along the length of the laser crystal mount at an interface of the lower and upper housings.

As depicted in FIGS. 1 and 2, previous configurations of laser crystal mounts 110 have traditionally been side-cooled, which has presented various issues and/or disadvantages. In particular, the side-cooled laser crystal mount configurations illustrated in FIGS. 1 and 2 involved removing heat from the laser crystal mount 110 using edge-mounted heat pipes 220 that run parallel to the PWG laser crystal 210 length and parallel to the PWG laser crystal 210 unguided dimension. This resulted in asymmetric heat pathways that induced unacceptable laser beam steering (from unmanaged thermal gradients) and other thermally induced optical aberrations. In some instances, in an attempt to counteract the unwanted thermal asymmetry, the aforementioned previous PWG laser crystal mounts (illustrated in FIGS. 1 and 2) incorporate thermal choke features into the crystal mount. In these laser crystal mount configurations, the thermal choke features are traditionally prescribed and integrated into at least one of the upper and lower housings 127 and 117 of the laser crystal mount to reduce the beam steering magnitude. However the thermal choke features are not capable of fully managing the asymmetry issues, and traditionally come at the cost of additional thermal imprinting and stress in the laser crystals 210 that further degrades laser beam quality and laser efficiency.

Further, the edge mounted heat pipe PWG mounting assemblies 200 and 300, illustrated in FIGS. 1 and 2 disadvantageously introduce significant thermal aberration issues and have both laser power scalability and thermal transient limitations. This is driven primarily by the thermal gradient that sets up across the unguided dimension (UGD) of the PWG laser crystals 110 due to the positive thermal dispersion in the laser crystal 210. In the case of single-side mounted heat pipes (not illustrated), a first order wavefront tilt may be induced, which results in the laser output beam being pulled toward the hotter edge of the laser crystal (if the PWG do/dT is positive). In addition, asymmetric thermal aberrations and stress in the laser crystal result from the thermal choke features that must be integrated into the single-side cooled configuration to mitigate the wavefront tilt issue. In the case of dual-side mounted heat pipes/heat straps 220 (as illustrated in FIGS. 1 and 2), the wavefront tilt effect can be effectively managed, and the thermal chokes can be removed, but this comes with a penalty of increasing the overall thermal lens focal power due to the inherent thermal gradient induced by the optical pumping scheme being magnified by pulling heat across the unguided dimension of the PWG laser crystal.

The critical shortfalls of previous PWG laser crystal assemblies are addressed with the PWG laser crystal assembly of the various embodiments described herein by improving the thermal transient performance and minimizing optical aberrations. The PWG laser crystal mounting methods described herein (hotpressed and reflowed indium or indium-silver, or thermal gap pads combined with prescribed bold torqueing procedures and annealing methods) ensure low stress mounting of various types of PWG crystals. Unlike the aforementioned prior art configuration, in the PWG laser crystal assembly of the various embodiments described herein, unwanted heat is removed orthogonal to the unguided dimension of the PWG laser crystal, which reduces the inherent thermal gradient induced by the optical pumping of the laser crystal. This improvement reduces the magnitude of the natural thermal lens effects and reduces higher order optical aberration content within the PWG laser crystal so that downstream optical components require less corrective power and less higher order aberration mitigation.

Figure 3:
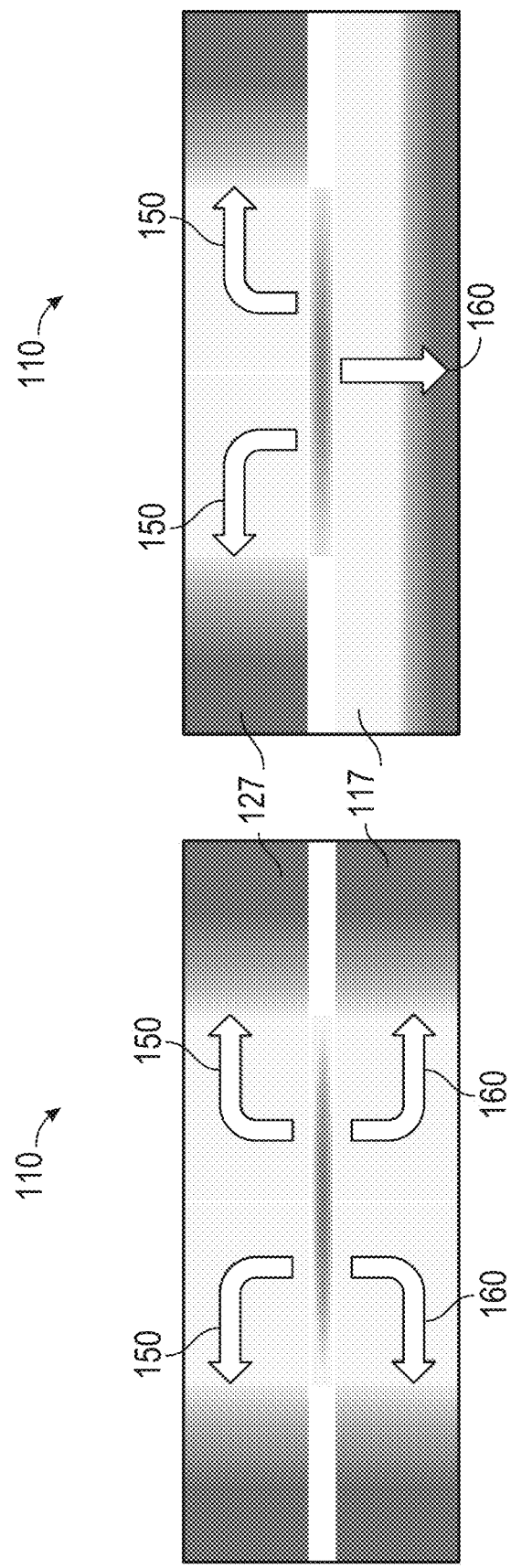
FIG. 3A is an illustration of a heat dissipation profile of the heat dissipating structure which is side-mounted to a laser crystal mount of a laser crystal assembly.
FIG. 3B is an illustration of a heat dissipation profile of a heat dissipating structure which is bottom-mounted to an exemplary laser crystal mount of the planar waveguide laser crystal assembly, in accordance with some embodiments of the present disclosure.

FIG. 3A is an illustration of a heat dissipation profile of a heat dissipating structure which is side-mounted to a laser crystal mount of a prior art laser crystal assembly. As illustrated in FIG. 3A, in the configuration where the thermal management system or heat dissipating structure, in this case the heat pipes/heat straps 220 (illustrated in FIGS. 1 and 2) are side-mounted heat straps half of the heat will flow out through the sides of the upper housing (as illustrated by arrows 150) into the heat straps 220 and the other half of the heat will flow out through the sides of the lower housing (as illustrated by arrows 160) into the heat straps 220. This configuration produces the maximum unguided dimension (UGD) thermal gradient as heat flows out from the laser crystal 210 and through the sides of the upper and lower housings 127 and 117.

The laser crystal mounting assemblies of the various embodiments described herein and the associated thermal management or heat dissipation systems provide advancements over the previous laser crystal mounting assemblies the side-mounted heat dissipating structure, heat pipes/heat straps 220 by providing a configuration in which the thermal management or heat dissipation systems are bottom and/or top mounted to the laser crystal mount so as to decrease the UGD thermal gradient, thereby allowing the crystal to be pumped from the cold initial state to the fully operational laser crystal state while consuming as little power as possible. Since the UGD thermal gradient is smallest where heat flowing to the sides of the laser crystal mount 110 is minimized, the laser crystal mounting assemblies of the various embodiments described herein are configured to cut the UGD thermal gradient at least in half. The UGD thermal gradient is cut at least in half by mounting the thermal management or heat dissipation systems of the various embodiments described herein (e.g., oscillating heat pipes) to a bottom (horizontal exterior) surface 115 of the lower housing 117 and/or a top (horizontal exterior) surface 125 of the upper housing 127 so that heat flows directly downwards and/or upwards versus to the sides of the laser crystal mount, as illustrated in FIG. 3B.

FIG. 3B, illustrates a heat dissipation profile of a heat dissipating structure which is bottom-mounted to an exemplary laser crystal mount of the planar waveguide laser crystal assembly, in accordance with some embodiments of the present disclosure. As depicted in FIG. 3B, in embodiments where the heat dissipating structure is bottom-mounted to the laser crystal mount 110, half of the heat will flow out to the sides (as illustrated by arrows 150) into the heat straps 220 and then wrap downwards, and the other half of the dissipated heat will flow straight down (as illustrated by arrows 160). Because half of the heat (i.e. the heat dissipated downwards towards the bottom-mounted heat dissipating structure) flows directly down without first flowing to the sides, leaving only half of the heat flowing to the side as illustrated by arrows 150, the UGD thermal gradient of the laser crystal mounting assemblies of the various embodiments described herein is advantageously cut in half as compared to the side-mounted configurations.

Figure 4:
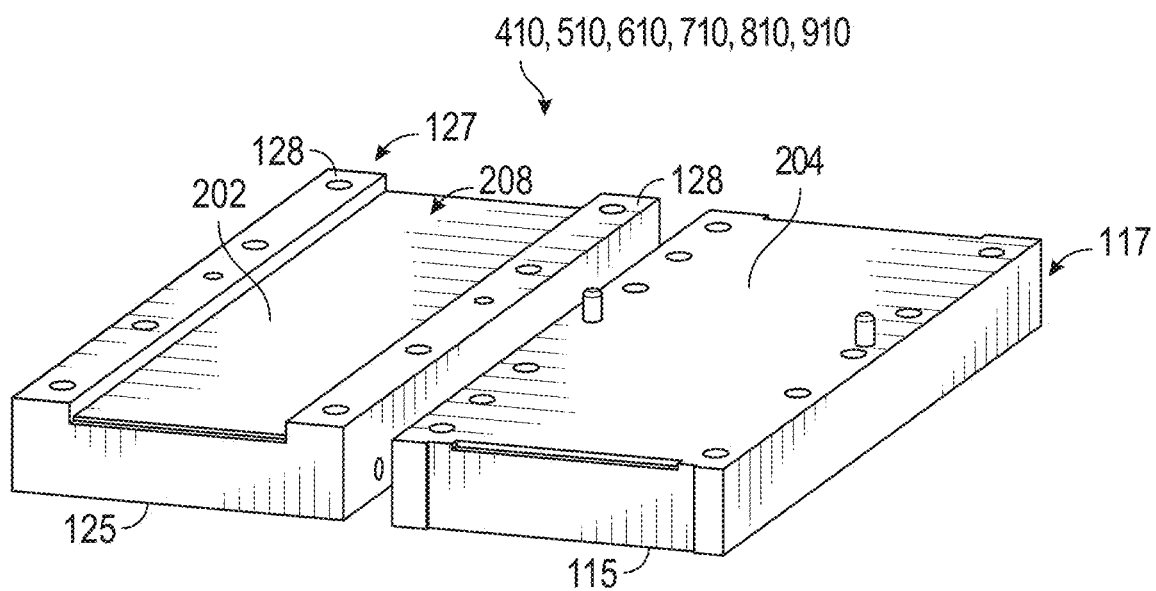
FIG. 4 is an isometric view of a laser crystal mount of the exemplary planar waveguide laser crystal assembly, in accordance with some embodiments of the present disclosure.
Figure 5:
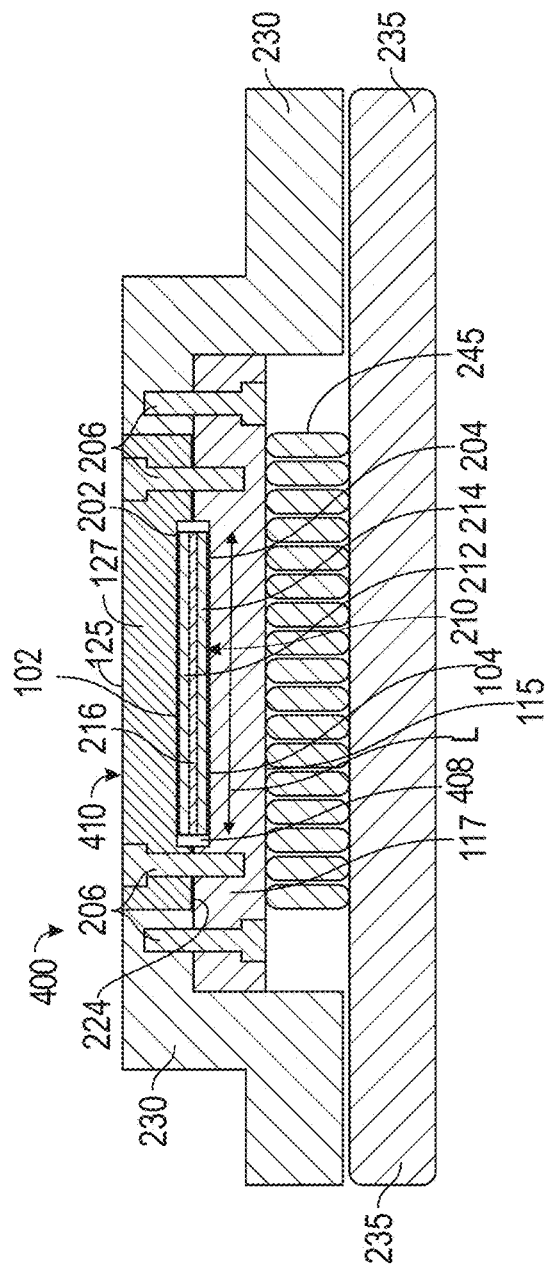
FIG. 5 is a cross-sectional view of an exemplary laser crystal assembly having a bottom-mounted heat dissipating structure with non-embedded heat pipes, in accordance with some embodiments of the present disclosure.

FIG. 4 is an isometric view of a laser crystal mount of the exemplary planar waveguide laser crystal assembly, in accordance with some embodiments of the present disclosure. FIG. 5 is a cross-sectional view of an exemplary laser crystal assembly 400 having a bottom-mounted heat dissipating structure including non-embedded heat pipes 245, in accordance with some embodiments of the present disclosure. In accordance with various embodiments, the exemplary laser crystal assembly 400 may include an optical bench 230 for mounting at least one optical element, the laser crystal mount 410 mounted on the optical bench 230, and a PWG laser crystal 210 mounted in the cavity of the crystal mount 410. The laser crystal assembly 400 may further include a heat dissipating structure 245 thermally coupled to at least one of the upper and lower housings 127 and 117 to uniformly and quickly dissipate heat from the crystal mount 410.

A. Crystal Mount:

1. Housing:

As depicted, the laser crystal assembly 400 may include a laser crystal mount 410 mounted on the optical bench 230. Similar to the crystal mount 110, the laser crystal mount 410 may include an upper housing 127 and a lower housing 117. In some embodiments, high thermal resistance kinematic mounting features (e.g., fasteners 206 may be integrated into the laser crystal mount 410 for mounting the laser crystal mount to the optical bench 230 in such a manner that thermal, optical and mechanical requirements are satisfied as shall be described in further detail below. This approach forces the majority of the heat to pass from the crystal mount 410 into the downstream thermal management system (herein also referred to as the "heat dissipating structure 245") rather than into the optical bench 230.

The upper and lower housings 127 and 117 may also be coupled to each other using a similar coupling mechanism, e.g., the plurality of fasteners 206 used to mount the crystal mount 410 to the optical bench. In accordance with some embodiments, the fasteners 206 may be inserted to join the upper and lower housings at a predetermined torque, optimized for the specific thermal interface material compression desired, to ensure uniform clamping force is applied to keep the laser crystal securely mounted within the laser crystal mount 410 in a low stress configuration. As depicted, the upper housing 127 may have an interior horizontal surface 202 and an exterior horizontal surface 125 opposite the interior horizontal surface. Similar to the upper housing, the lower housing 117 may have an interior horizontal surface 204 and an exterior horizontal surface 115 opposite the interior horizontal surface 202. The interior horizontal surfaces 202 and 204 of the upper and lower housings 127 and 117 may each include a depression or recess defined by an absence of material at least partially along the respective lengths of the interior horizontal surfaces 202 and 204 of the upper and lower housings 127 and 117. The depressions or recesses of the interior horizontal surfaces 202 and 204 may be positioned opposite to and mirroring each other so as to define a cavity 208 between the upper and lower housings 127 and 117. As shall be described below with further reference to FIGS. 5-8, the depressions or recesses defining the cavity 208 may be machined to dimensions appropriate for mounting of the PWG laser crystal 210 therein. For example, the surfaces defining the cavity 208 can be machined to a depth or thickness with a tolerance so as to accommodate a PWG laser crystal 210 of a predetermined size, and the compressed thermal interface material 202 and 204 between outer cladding layers 212 and 214 of the laser crystal 210. Accordingly, the upper and lower housings 127 and 117 of the crystal mount 410 may be manufactured to predetermined flatness values and tolerances required in order to have a very controlled and uniform final mounted PWG laser crystal inside the crystal mount 410.

In some embodiments, the material of the laser crystal mount 410 may be selected to be as thin and lightweight as possible. The lighter weight or the less material there is in the crystal mount 410, the less thermal inertia there is and therefore in general the faster the laser crystal will warm up once optically pumped. A lighter weight laser crystal mount may also advantageously reduce the overall footprint of the entire laser crystal assembly, thereby resulting in a reduced total system mass.

In some embodiments, the material of the laser crystal mount 410 may be Coefficient of Thermal Expansion (CTE) matched to the laser crystal CTE, and generally has natively high thermal conductivity. For example, in the case of yttrium aluminum garnet (YAG) crystal clad PWGs, various Copper Molybdenum (CuMo) and Copper Tungsten (CuW) alloys may be used for the respective upper and lower housings 127 and 117 (for example, 75Cu25Mo) that can be formulated to closely match YAG's CTE [7.8 PPM/K (111), 7.7 PPM/K (110), 8.2 PPM/K (100)]. In some embodiments, the upper housing 127 may be formed of a material having a higher thermal conductivity than the lower housing 117.

2. Thermal Interface Material:

In accordance with some embodiments, the laser crystal 210 includes upper and lower cladding layers 212 and 214, and a waveguide layer 216 interposed between the upper and lower cladding layers 212 and 214. In some embodiments, the upper and lower cladding layers 212 and 214 may be formed of an undoped Yttrium aluminum garnet (YAG) and the waveguide layer 216 may be formed of doped YAG. As described above, the surfaces defining the cavity 208 can be machined to a depth or thickness with a tolerance so as to accommodate compressed thermal interface material 102 and 104 between the outer cladding layers 212 and 214 of the laser crystal 210 and the depressions or recesses of the interior horizontal surfaces 202 and 204 defining the cavity 208.

In embodiments where the CTE of the laser crystal mount 410 and the laser crystal 210 is matched very closely, indium or indium-silver foil gaskets may be utilized as the thermal interface material 102 and 104 between outer cladding layers 214 and 216 of the PWG laser crystal 210 and interior horizontal surfaces 202 and 204 of the laser crystal mount 410. In the case of glass-based PWG laser cladding layer materials (e.g., Magnesium Fluoride clad PWGs, MFG.) CuMo and CuW alloys can be engineered to closely match the "perpendicular to c-axis" (6.2-9.3) PPM/K CTE range (for example, 60Cu40Mo) or the "parallel to c-axis" (10.814.6) PPM/K CTE range (for example, 40Cu60Mo) depending on mounting orientation. In cases where the outer material of the cladding layers 212 and 214 of the laser crystal 210 exhibits a large CTE range (for example, >2 ppm PPM/K) compliant thermal gap pad gasket material can be used (for example, Laird Tpli 220). These CuMo and CuW alloys have very good bulk thermal conductivity (for example, in the range of 150 to 270 W/M*K depending on formulation), and are also compatible with the necessary machining and plating methods required by the laser system, such as wire and probe EDM, high precision machining and surface grinding, Au plating over Ni flash, and other similar machining and plating methods.

In the embodiments where indium or indium-silver foil gaskets are used as the thermal interface material 102 and 104 between the PWG laser crystals and the interior thermal interfaces (i.e., the interior horizontal surfaces) of the crystal laser mount 410, the thermal interface may be formed by integrating indium or indium-silver foil into the depressions or recesses of the interior horizontal surfaces 202 and 204 defining the cavity 208 using either a hot-press/oven-annealing method, or using a liquid indium reflow or liquid indium-silver reflow method.

a) Hot-Press/Oven-Annealing Method:

In accordance with various embodiments described herein, the hot-press/oven-annealing method requires precision preparation and tolerances of the involved thermal interface surfaces, a novel mount assembly method involving a prescribed bolted interface with torqueing pattern performed at a temperature just below the melting point of the indium or indium-silver foil gasket, and an oven-annealing method that allows stress in the laser crystal to dissipate to acceptable levels as the assembly is brought down to room temperature.

(1) Preparation of Thermal Interface Surfaces and Mount Assembly Method

In accordance with various embodiments, the method of assembling the thermal material (for example, the indium or indium-silver foil gaskets 102, 104) in the cavity 208 begins with preparing the foil which will be used as the thermal interface material. In some embodiments, 100% indium may be selected as the thermal interface material 102 and 104 for its desirable characteristics, including, but not limited to the foil being softer and having better capability to stick to the waveguide better, as well as having an ideal compressive strength. In other embodiments, indium silver (ex 96/4 InAg) may be used. For example, 100% indium has a compressive strength in the range of 310 PSI which is advantageous for the various embodiments described herein because the PWG laser crystal mount can safely tolerate this class of clamping force during mounting operations. The aforementioned configuration is further advantageous because an array of fasteners which are capable of exceeding this force for fastening purposes are readily available at acceptable torque values. This allows the indium or indium-silver gasket to plastically deform during fastening of the two halves of the PWG laser crystal mount 410, thereby uniformly distributing the clamping force over the PWG interface surfaces. However, the various embodiments of the present disclosure are not limited to the aforementioned configuration, and any other material having similar characteristics may be used. The indium or indium-silver foil material is then cut to approximately +1 mm of the width of the laser crystal 210 in order to reduce risk of needing to work with blades to cut the foil near the optical aperture. In some embodiments, a shim is placed in the depression or recess of the interior horizontal surface 202 to act as a temporary surrogate in the place of where the indium or indium-silver foil gasket 102 will later be positioned. The shim may be positioned so as to create a gap between an outer horizontal surface of the cladding layer 214 of the laser crystal 210 and the non-recessed portion 208 (illustrated in FIG. 4) of the interior horizontal surface 202 of the upper housing 127. In some embodiments, the gap may be approximately 0.009" based on a stock size in which the indium or indium-silver is acquired, but the size of the gap may vary based on stock size in which the indium or indium-silver foil is procured, along with the intended application. In some embodiments, the shim may be made of a plastic material which is cut into a shape at least slightly wider and longer than the laser crystal 210.

In some embodiments, the method may further include placing and aligning a first layer of indium or indium-silver foil 104 on top of cladding layer 214 of the laser crystal 210 in the 0.009" gap, and lightly siping the top of indium or indium-silver foil layer 104 with razor to verify deformation of surface, rolling the indium or indium-silver foil from middle to ends using a clean stainless steel post to verify all siping marks are substantially reduced. Next, the laser crystal 210 and indium or indium-silver foil assembly and the shim may be removed from the upper housing 127. The laser crystal 210 and indium or indium-silver foil assembly may then be reinstalled with the approximately 0.009" thick indium or indium-silver foil layer 104 side down in the upper housing 127, and the laser crystal 210 centered therein. The size of the indium or indium-silver foil layer 104 may vary based on stock size in which the indium or indium-silver foil is procured, along with the intended application. A second layer of indium or indium-silver foil 102 may then be placed on top of the cladding layer 212 of the laser crystal 210 and the siping and rolling processes repeated to verify a uniform surface.

In accordance with some embodiments, the method may further include assembling the upper and lower housings 127 and 117 of the laser crystal mount 210 together. In the assembly process, the upper and lower housings may be joined using fasteners/bolts 206, for example, but not limited to, braycoated fasteners. The mounting method may further include torqueing the fasteners 206 in even increments and verifying PWG strain depolarization using standard optical methods at each increment to ensure uniform clamping force is achieved. For example, the fasteners 206 may be torqued with a torqueing pattern performed at a temperature just below the melting point of the indium or indium-silver foil gasket layers 102 and 104. The laser crystal/indium or indium-silver foil gasket assembly is mounted in the crystal mount 410, the next step of oven-annealing may then be performed on the crystal mount 410.

(2) Oven-Annealing

In accordance with some embodiments, the oven annealing step includes placing the crystal mount 410 in a vacuum oven and raising temperature to a temperature which is just below the melting point of the thermal interface material, e.g., the indium or indium-silver foil layers 102 and 104 without melting the thermal interface material (i.e., the indium or indium-silver foil layers 102 and 104). The crystal mount 410 may be held at this temperature until depolarization decreases to an acceptable value. The heating softens the thermal interface material 102 and 104, and allows the upper and lower housings 127 and 117 of the crystal mount 410 to press against each other uniformly. Due to the torque exerted during installation of the fasteners 206, the upper and lower housings 127 and 117 of the crystal mount 410 press against each other to close the crystal mount 410. The crystal mount 410 is then allowed to cool and de-stress at room temperature. Accordingly, the methods of mounting the PWG laser crystals as described according to various embodiments herein yield the advantage of a configuration of a low-stress mounting of the PWG laser crystal 210 in the laser crystal mount 410. The hot-press/oven-annealing method has the unique advantage of a very controlled process with low execution risk and high success rate.

In accordance with some embodiments of the hot-press/oven-annealing method, additional gap-filling gaskets may be installed between 127 and 117 with the intent to compress the gasket to nearly zero thickness, with the purpose of causing a void free interface between the upper and lower housings 127 and 117. For example, Indium Tin (InSn), which liquifies at ~117° C. such that it becomes liquid while the In gasket is still solid, may be used as a gasket material. In these embodiments, this InSn gasket filler material may be expressly used to accommodate any potential imperfect flatness of the upper and lower housings 127 and 117.

b) Liquid Indium Reflow Method:

In some embodiments, the liquid indium reflow or liquid indium-silver reflow method involves the use of gauge tooling to set the PWG laser crystal position and liquid indium or liquid indium-silver bondline thicknesses. In some embodiments, the liquid indium reflow or liquid indium-silver reflow method further comprises controlling the indium or indium-silver melting rate and indium or indium-silver joint reflow order. For example, the laser crystal mount 410 may be assembled utilizing the same indium or indium-silver rollout and siping methods described above, but with a variation of using the vacuum oven to heat the laser crystal mount 410 assembly until it exceeds the melting temperature of the indium or indium-silver gasket thermal interface materials 102 and 104. This allows the upper and lower housings 127 and 117 to close against each other by gravity without requiring torqueing of the fasteners 206.

In accordance with some embodiments, instead of using a vacuum oven, a simple hot plate may be used in combination with a temporary heatsink to promote liquid reflow of only one of the indium or indium-silver gaskets 102 and 104 at a time. This allows for a more controlled reflow method.

In some embodiments gauge pins that are contained by gauge tooling may be inserted between the mating surfaces 202 and 204 of the laser crystal mount at the four corners of the PWG laser crystal mount 410 to control and set the reflowed thickness of the indium or indium-silver gaskets 102 and 104. After the PWG laser crystal mount 410 assembly is cooled the gauge tooling and pins may be removed, leaving only a small void in the otherwise uniform indium or indium-silver gaskets 102 and 104. These liquid indium-reflow and liquid indium-silver reflow methods have the unique advantage of reducing the required tolerances of the involved thermal interface surfaces and reducing the oven-annealing timeline as compared to the hot-press/oven-annealing method.

3. Thermal Gap Pads:

In accordance with various embodiments of the present disclosure, in lieu of the indium or indium-silver foil, thermal gap pads may be used as the thermal interface material between the PWG laser crystal 210 and the mating surfaces 202 and 204 of the laser crystal mount. In these embodiments, the thermal gap pads can be integrated by first die-cutting precisely fit gasket preforms and then assembling the thermal gap pad gasket preforms at room temperature. Similar to the configurations and methods described above where indium or indium-silver is used as the thermal interface material, a prescribed bolted interface with torqueing pattern may be performed to ensure uniform clamping force and gap pad compression is achieved.

As depicted in FIG. 5, in some embodiments, thermal gap pads or indium/indium-silver foil gaskets 224 similar to the thermal gap pads or indium/indium-silver foil gaskets 102 and 104 described above may be used as a thermal interface material in the interface joining the non-recessed portion 128 (illustrated in FIG. 4) of the interior horizontal surface 202 of the upper housing 127 and the interior horizontal surface 204 of the lower housing 117 of the laser crystal mount 410. In these embodiments, the thermal gap pads or indium foil/indium-silver gaskets 224 can be integrated with similar methods as described above with respect to the thermal gap pads or indium/indium-silver foil gaskets 202 and 204. In some embodiments, however, if the internal interfaces of the laser crystal mount 210 (i.e., the interior horizontal surfaces 202 and 204) are prepared to sufficient flatness and finish (roughness), no intermediate interface material may be required, depending on the application.

Figure 6:
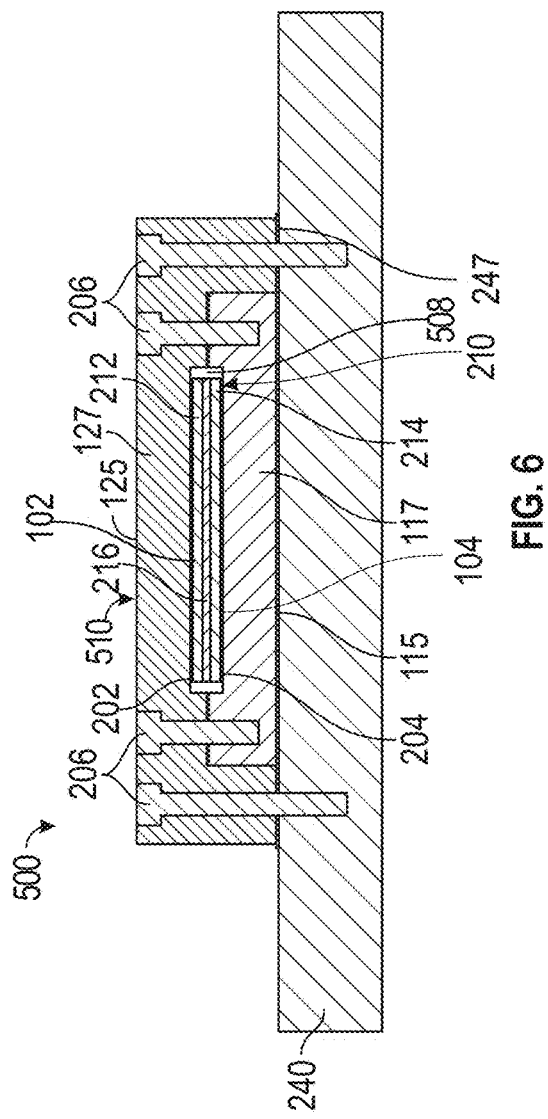
FIG. 6 is a cross-sectional view of an exemplary laser crystal assembly having a bottom-mounted heat dissipating structure with optical bench-embedded heat pipes, in accordance with some embodiments of the present disclosure.

B. Thermal Management Systems:

As illustrated in the various embodiments of FIGS. 5, heat dissipating structures 245 may be oriented vertically, and thermally coupled to the exterior horizontal surface 115 of the lower housing 117 to uniformly and quickly dissipate heat transferred from the laser crystal 210 and the crystal mount 410 housing the laser crystal 210 to a downstream thermal plane such as heat pipe 235. As depicted, each of the exterior horizontal surfaces 125, 115 of the upper and lower housings 127, 117 may be oriented parallel to a length L of the laser crystal 210. In accordance with some embodiments, the heat dissipating structures 245 may be heat straps, e.g., graphite fiber heat straps which are mounted or otherwise thermally coupled to the exterior horizontal surface 115 of the lower housing 117. In other embodiments, the heat dissipating structures 245 may be oscillating heat pipes which are mounted or otherwise thermally coupled to the exterior horizontal surface 115 of the lower housing 117. The heat dissipating structures 245 connects the crystal laser mount 410 to the downstream thermal plane such as heat pipe 235. In the embodiments illustrated in FIG. 5, the thermal plane 235 is not embedded in the optical bench 230—however, in other embodiments e.g., the thermal plane 235 may be embedded in the optical bench as illustrated in FIG. 6. In some embodiments, the thermal conductivity of the heat dissipating structure 245 may be greater than that of the optical bench. For example, the heat dissipating structure 245 may be a graphite fiber heat strap or oscillating heat pipes while the optical bench may be formed of titanium. The aforementioned configuration advantageously allows for the heat dissipating structure 245 to absorb heat from the crystal laser mount at rates higher than any heat transferring from the crystal mount 210 to the optical bench 230.

In accordance with some embodiments, the lower housing 117 of the laser crystal mount 410 may be a solid bulk material or may integrate augmenting thermal technologies in order to efficiently move heat from the laser crystal to a thermal dissipation surface or surfaces (e.g., the exterior horizontal surface 115) of the lower housing 117. The ideal surfaces for thermal dissipation on the crystal mount 410 are the two broad surfaces (i.e., the exterior horizontal surfaces 125 and 115) of the upper and/or lower housings 127 and/or 117 of the laser crystal mount 410. These surfaces are oriented orthogonal to both the unguided dimension (UGD) of the PWG laser crystal and the optical length of the PWG laser crystal. These surfaces are ideal because the resulting heat flow pathways through the laser crystal mount 410 will naturally minimize the thermal gradient within the laser crystal 210 that results from the optical pumping of the laser crystal 210.

These exterior horizontal surfaces 125 and 115 of the upper and lower housings 127 and 117 are also ideal because they naturally provide the largest thermal interface areas to attach a variety of thermal management options (referred to herein as heat dissipating structures), for example, liquid-cooled blocks, phase change material, heat pipes, copper or graphite thermal straps, etc. . . . to remove heat from the PWG laser crystal assembly. Minimizing the UGD thermal gradient in the laser crystals is desired to reduce thermal lensing and other associated optical aberrations. Minimizing the UGD thermal gradient with the ideal orthogonal heat-flow geometry also results in maximizing the rate of heat removal from the PWG laser crystal assembly overall. This reduces laser turn-on times, improves laser beam quality, reduces stress in the mounted laser crystal, improves mechanical mounting stability, and reduces the amount of heat that can unwittingly pass into the mechanical structure that holds the laser crystal mount components.

FIG. 6 is a cross-sectional view of an exemplary laser crystal assembly 500 having a bottom-mounted heat dissipating structure with optical bench-embedded heat pipes, in accordance with some embodiments of the present disclosure. Similar to the crystal mount 410, the laser crystal mount 510 may include an upper housing 127 and a lower housing 117. Additionally, similar to the embodiments of FIG. 5, high thermal resistance mounting features (e.g., fasteners 206) may be integrated into the laser crystal mount 510 for mounting the laser crystal mount to the optical bench 230 in such a manner that thermal, optical and mechanical requirements are satisfied. Similar to the embodiments of FIG. 5, this configuration forces the majority of the heat to pass from the crystal mount 510 into the downstream thermal management system (herein also referred to as the "heat dissipating structure 245") rather than the mechanical structure of the laser crystal mount 510.

The embodiments of FIG. 6 differ from those of the embodiments of FIG. 5 in that the heat dissipating structure may be embedded in the optical bench 240. For example, in some embodiments, the heat dissipating structure may be a heat pipe such as a traditional heat pipe or an oscillating heat pipe, a vapor chamber, or a heat spreader which his embedded in the optical bench. In these embodiments, the optical bench 240 may include at least one hole or aperture through which heat may pass from the crystal mount 510 to the optical bench embedded heat dissipating structure. Similar to the embodiments of FIG. 5, the upper and lower housings 127 and 117 may also be coupled to each other using a similar coupling mechanism, e.g., the plurality of fasteners 206 used to mount the crystal mount 610 to the optical bench 240. As described with respect to FIG. 5 above, the fasteners 206 may be inserted to join the upper and lower housings at a predetermined to ensure uniform clamping force is applied to keep the laser crystal 210 securely mounted within the laser crystal mount 510 in a low stress configuration. Elements of the crystal mount 510 having similar structure to that of the crystal mount 410 are numbered similarly herein, thus a detailed description thereof shall be omitted with respect to FIG. 6.

The various embodiments illustrated in FIG. 6 have the advantage that since both the upper and lower housings 127 and 117 are mounted to the optical bench embedded heat dissipating structure, heat may be dissipated not only from the exterior horizontal surface of the lower housing 117, but also from the upper housing which his coupled to the optical bench. In some embodiments, as depicted in FIG. 6, a thermal block or spacer 247 may be positioned between the crystal mount 510 and the optical bench 240 so as to avoid placing heat directly onto the optical bench 240 which may cause alignment issues for the laser crystal 210.

FIG. 7A is a cross-sectional view of an exemplary laser crystal assembly having a bottom-mounted heat dissipating structure with thermal choke and optical bench-embedded heat pipes, in accordance with some embodiments of the present disclosure. FIG. 7B is a cross-sectional view of an exemplary laser crystal assembly having a bottom-mounted heat dissipating structure with thermal choke and optical bench-embedded heat pipes, in accordance with some embodiments of the present disclosure. The embodiments of FIGS. 7A and 7B are similar in structure to those of FIG. 6, only differing from FIG. 6 in that thermal chokes 170 and 175 may be incorporated into each of the respective lower housings 117. In the embodiments illustrated in FIG. 7A, the thermal choke 170 may be installed to choke the middle of the embedded heat dissipating structure. In the embodiments illustrated in FIG. 7B, the thermal choke 175 may be installed at the wings or at the edges of the unguided dimension of the PWG laser crystal 210. The configuration of FIG. 7B is advantageous over that of FIG. 7 because installing the thermal choke 175 at the wings or at the edges of the unguided dimension of the PWG laser crystal 210 would cause a decrease in the unguided dimension lens magnitude.

Figure 8:
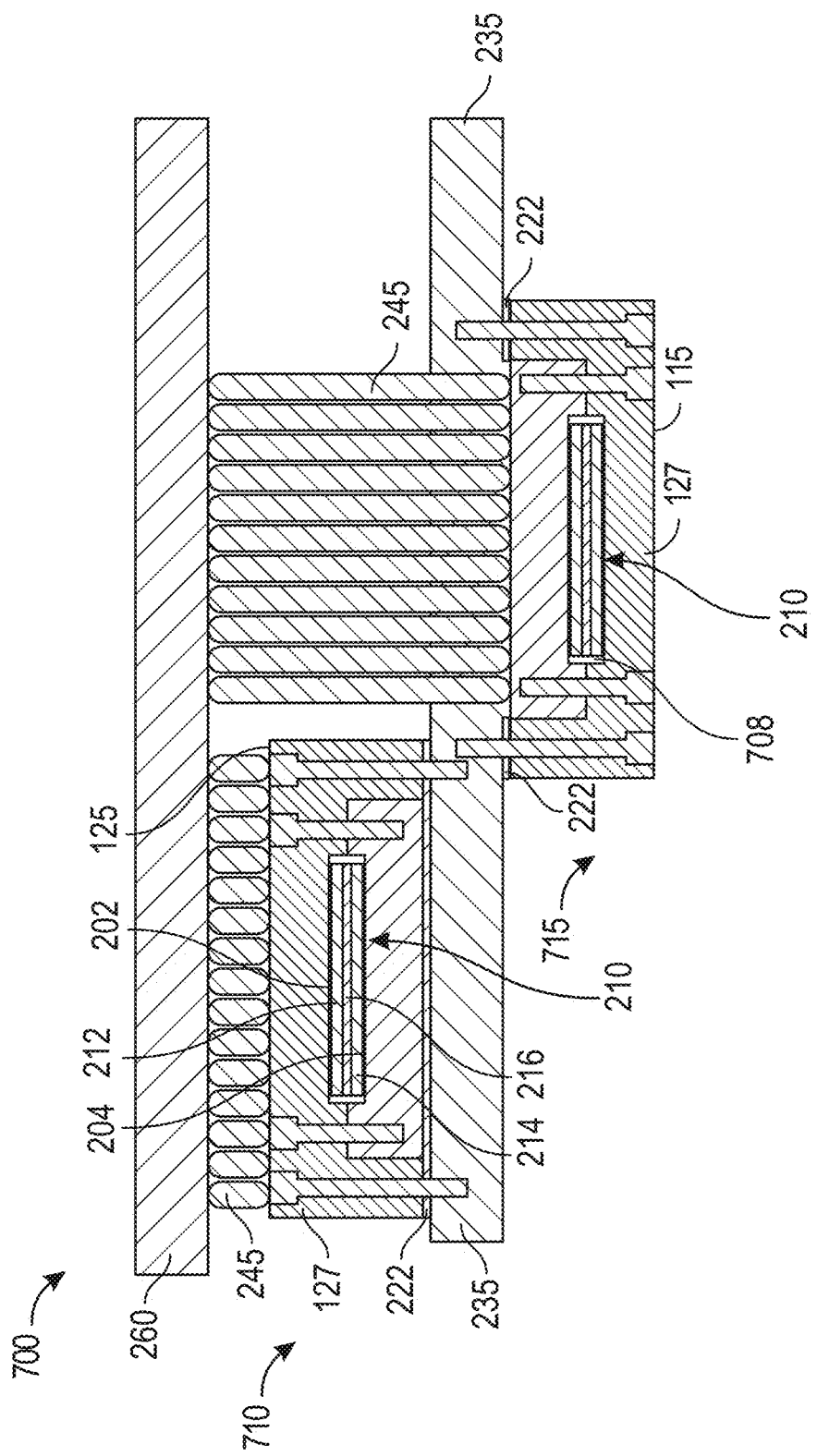
FIG. 8 is a cross-sectional view of an exemplary hybrid laser crystal system having both bottom-mounted and top-mounted heat dissipating structures, in accordance with some embodiments of the present disclosure.

FIG. 8 is a cross-sectional view of an exemplary hybrid laser crystal system having both bottom-mounted and top-mounted heat dissipating structures, in accordance with some embodiments of the present disclosure. The embodiments of FIG. 8 illustrate a configuration of a hybrid top-cooled and bottom-cooled concept where a heat dissipating structure 245 may be both mounted to a horizontal exterior surface 125 of the upper housing 127 of a first crystal mount 710, and mounted to a horizontal exterior surface 115 of the lower housing 117 of a second crystal mount 715. In these embodiments, the first and second laser crystal mounts 710 and 715 would be positioned on opposite sides of the optical bench 235. As depicted in FIG. 8, the heat dissipating structure 245 may be heat straps, e.g., graphite fiber heat straps which are mounted or otherwise thermally coupled to the exterior horizontal surfaces 125 and 115 of the respective upper and lower housings 115 and 117. In other embodiments, the heat dissipating structures 245 may be oscillating heat pipes which are mounted or otherwise thermally coupled to the exterior horizontal surfaces 125 and 115 of the respective upper and lower housings 115 and 117. In accordance with some embodiments, a pocket may be created in the optical bench to allow heat to be passed from the lower housing 117 up to a lid 260 or similar structure which dissipates the heat from the system. FIG. 8 shows the flexibility of the PWG mounting architecture having a symmetric clamshell design that could be cooled either on the top or on the bottom. In some embodiments, as illustrated in FIG. 8, a thermal block 222 may be positioned or interposed between the optical bench 235 and the crystal mounts 710 and 715 so as to minimize heat transfer from the crystal mounts 710 and 715 to the optical bench 235. The thermal block 222 may be a thermally insulating material, or simply a space or absence of material. For example, the thermal block 222 may be a titanium washer or some low thermal conductivity glass or other similar thermal insulator.

FIG. 9A is an isometric view of an exemplary laser crystal assembly having a bottom-mounted heat dissipating structure including a vapor chamber and flat oscillating heat pipes, in accordance with some embodiments of the present disclosure. FIG. 9B is side cross-sectional view of the exemplary laser crystal assembly of FIG. 9A, in accordance with some embodiments of the present disclosure. FIG. 9C is an exploded isometric view of the exemplary laser crystal assembly of FIG. 9A, in accordance with some embodiments of the present disclosure.

Similar to the crystal mount 410, the laser crystal mount 910 may include an upper housing 127 and a lower housing 117. In some embodiments, high thermal resistance mounting fasteners may be integrated into the laser crystal mount 910 for mounting the laser crystal mount 910 to the optical bench 120. Similar to the embodiments of FIG. 5, this configuration forces the majority of the heat to pass from the crystal mount 910 into the downstream thermal management system (or heat dissipating structures) 180 and 190 rather than the optical bench 120 or the mechanical structure of the laser crystal mount 910. The embodiments of FIGS. 9A-9C differ from those of the embodiments of FIG. 5 in that the thermal management system may include a vapor chamber 190 which is embedded in the optical bench 240. The vapor chamber 190 may be thermally coupled to another heat dissipating structure such as an oscillating heat pipe 180 which may transport the unwanted heat out of the system. In these embodiments, the optical bench 120 may include at least one hole or aperture through which heat may pass from the laser crystal mount 910 to the downstream vapor chamber 190 and oscillating heat pipe 180.

In some embodiments the vapor chamber 190 may be mounted to the exterior horizontal surface 125 of the upper housing 127, and thermally coupled to a secondary heat dissipating structure such as the oscillating heat pipe 180 which may transport the unwanted heat out of the system. Alternatively, an oscillating heat pipe may be attached directly to the exterior horizontal surface 125 of the upper housing 127 without the use of the vapor chamber 190. In these embodiments, the optical bench 120 would not require a hole or aperture. In some embodiments where multiple PWG laser crystals mount assemblies or laser amplifiers are mounted to one common optical bench 120, combinations of top and bottom cooled laser crystal mount assemblies may be used in the manner described with respect to FIG. 8. This configuration advantageously facilitates the routing of downstream thermal management components to convenient locations such as the interior of a lid of a hermetic enclosure.

The PWG laser crystal assemblies of the various embodiments described herein yield several advantages over existing or prior art PWG laser crystal mounting assemblies which traditionally utilize pumped water or waterglycol cooled mounts (Gemini, GSK, Wander, Prowler, ROSSA) with an external pump/chiller system. In these cases, liquid coolant fittings are integrated into upper and lower housings of the laser crystal mount, and liquid coolant channels are drilled along the optical length of the PWG laser crystal or across the unguided dimension of the laser crystals. This approach provides an adequate solution for some applications, but is not acceptable for many fielded applications. For applications where water cooling is not viable, heat has been traditionally removed from the laser crystal mount from edge mounted heat pipes running parallel to the PWG length and parallel to the PWG unguided dimension. This resulted in asymmetric heat pathways that induced unacceptable laser beam steering (from unmanaged thermal gradients) and other thermally induced optical aberrations. Further, the aforementioned PWG laser crystal mounts have included thermal choke features in order to counteract the unwanted thermal asymmetry. In these laser crystal mount configurations, the thermal choke features are traditionally prescribed and integrated into the halves of the laser crystal mount to reduce the beam steering magnitude, however the thermal choke features are not capable of fully managing the asymmetry issues, and come at the cost of additional thermal imprinting and stress in the laser crystals that further degrades laser beam quality and laser efficiency.

The planar waveguide laser crystal assemblies of the various embodiments described herein are provided to overcome the shortcomings of the prior art laser crystal assemblies described above. In particular, the PWG laser crystal mounting methods and assemblies of the various embodiments of the present disclosure may be used for application where water cooling is not an acceptable form of heat dissipation, e.g., in many high TRL (product) applications. The power required to circulate working fluid with pumps in conventional PWG laser crystal mounting assemblies reduces total system efficiency, and pumps reduce system reliability, introduce vibrations, and limit overall system lifetime. In addition, with the conventional PWG laser crystal mounting assemblies, customer requirements often dictate more sophisticated passive methods be utilized such as heat pipes or thermal straps connecting the laser system to a prescribed thermal plane.

The edge mounted heat pipe PWG mounting assemblies, described above disadvantageously introduce significant thermal aberration issues and have both laser power scalability and thermal transient limitations. This is driven primarily by the thermal gradient that sets up across the unguided dimension of the PWG laser crystals due to the positive thermal dispersion in the laser crystal. In the case of single-side mounted heat pipes, a first order wavefront tilt may be induced, which results in the laser output beam being pulled toward the hotter edge of the laser crystal. In addition, asymmetric thermal aberrations and stress in the laser crystal result from the thermal choke features that must be integrated into the single-side cooled configuration to mitigate the wavefront tilt issue. In the case of dual-side mounted heat pipes (as illustrated in FIGS. 1 and 2), the wavefront tilt effect can be effectively managed, and the thermal chokes can be removed, but this comes with a penalty of increasing the overall thermal lens focal power due to the inherent thermal gradient induced by the optical pumping scheme being magnified by pulling heat across the unguided dimension of the PWG laser crystal.

The critical shortfalls of previous PWG laser crystal assemblies are addressed with the PWG laser crystal assembly of the various embodiments described herein by improving the thermal transient performance and minimizing optical aberrations. The PWG laser crystal mounting methods described herein (hotpressed and reflowed indium, indium-silver, or thermal gap pads combined with prescribed bold torqueing procedures and annealing methods) ensure low stress mounting of various types of PWG laser crystals. Heat is removed orthogonal to the unguided dimension of the PWG laser crystal which reduces the inherent thermal gradient induced by the optical pumping system. This improvement reduces the magnitude of the natural thermal lens effects and reduces higher order optical aberration content within the PWG laser crystal so that downstream optical components require less corrective power and less higher order aberration mitigation.

The end result of this is an improved laser output beam quality, improved laser efficiency, and improved beam pointing stability. Further advantageously, the addition of integrated performance augmenting thermal technologies (for example, vapor chambers, oscillating heat pipes, and advanced heat spreaders) into the PWG laser crystal assembly can further reduce the magnitude of thermal lens and reduce higher order aberration content by increasing the effective thermal conductivity and heat spreading capability of the PWG laser crystal mount. The thermal transient time for the laser system can also be improved by effectively reducing the thermal inertia of the PWG laser crystal mount with the addition of these technologies, but is not required for all applications. Further advantageously, total system mass can be reduced by implementing performance augmenting thermal technologies into the PWG clamshell, which is generally desirable for most applications.

The various embodiments of the present disclosure, thus provide PWG laser crystal mounting methods and assemblies having improved laser output beam quality, improved laser efficiency, and improved beam pointing stability. Further advantageously, the addition of integrated performance augmenting thermal technologies (for example, vapor chambers, oscillating heat pipes, and advanced heat spreaders) into the PWG laser crystal assembly can further reduce the magnitude of thermal lens and reduce higher order aberration content by increasing the effective thermal conductivity and heat spreading capability of the PWG laser crystal mount. The thermal transient time for the laser system can also be improved by effectively reducing the thermal inertia of the PWG laser crystal mount with the addition of these technologies, but is not required for all applications. Further advantageously, total system mass can be reduced by implementing performance augmenting thermal technologies into the PWG clamshell, which is generally desirable for most applications.

The previous description is provided to enable any person skilled in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the terms "a set" and "some" refer to one or more. Pronouns in the masculine (e.g., his) include the feminine and neuter gender (e.g., her and its) and vice versa. Headings and subheadings, if any, are used for convenience only and do not limit the embodiments disclosed herein.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U. S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A planar waveguide laser crystal assembly, comprising:
an optical bench for mounting at least one optical element;
a laser crystal mount mounted on the optical bench, the laser crystal mount comprising:
an upper housing having an interior horizontal surface and an exterior horizontal surface opposite the interior horizontal surface;
a lower housing coupled to the upper housing, the lower housing having an interior horizontal surface and an exterior horizontal surface opposite the interior horizontal surface; and
a cavity defined between the interior horizontal surfaces of the upper and lower housings;
a laser crystal mounted in the cavity of the laser crystal mount, wherein each of the exterior horizontal surfaces of the upper and lower housings is oriented parallel to a length of the laser crystal, wherein the laser crystal comprises upper and lower cladding layers and a waveguide layer interposed between the upper and lower cladding layers and each of the upper and lower cladding layers of the laser crystal has an interior cladding surface abutting opposite surfaces of the waveguide layer and exterior cladding surfaces opposite the interior cladding surfaces;
a heat dissipating structure thermally coupled to the exterior horizontal surface of at least one of the upper and lower housings to dissipate heat from the laser crystal mount; and
a thermal interface material interposed between each of (1) the interior horizontal surface of the upper housing and the exterior cladding surface of the upper cladding layer, and (2) the interior horizontal surface of the lower housing and the exterior cladding surface of the lower cladding layer.

2. The planar waveguide laser crystal assembly of claim 1, wherein a co-efficient of thermal expansion (CTE) of at least one of the upper housing and the lower housing matches a CTE of the laser crystal.

3. The planar waveguide laser crystal assembly of claim 2, wherein the laser crystal comprises at least one of a yttrium aluminum garnet (YAG) crystal cladding, and a glass-based crystal cladding.

4. The planar waveguide laser crystal assembly of claim 3, wherein at least one of the upper and lower housings comprises a Copper Molybdenum (CuMo) alloy or a Copper Tungsten (CuW) alloy.

5. The planar waveguide laser crystal assembly of claim 3, wherein each of the upper and lower housings comprises undoped YAG, and the waveguide layer comprises doped YAG.

6. The planar waveguide laser crystal assembly of claim 3, wherein the upper housing comprises a higher thermal conductivity than the lower housing.

7. The planar waveguide laser crystal assembly of claim 1, wherein the thermal interface material comprises at least one of an indium foil gasket, an indium-silver foil gasket, and a thermal gap pad.

8. The planar waveguide laser crystal assembly of claim 1, further comprising a thermal interface material interposed at an interface between the interior horizontal surfaces of the upper and lower housings.

9. The planar waveguide laser crystal assembly of claim 8, wherein the thermal interface material comprises at least one of an indium foil gasket, an indium-silver foil gasket, and a thermal gap pad.

10. The planar waveguide laser crystal assembly of claim 1, wherein the heat dissipating structure is selected from the group consisting of an embedded vapor chamber, a heat pipe, and an advanced heat spreader.

11. The planar waveguide laser crystal assembly of claim 1, wherein the heat dissipating structure comprises an oscillating heat pipe.

12. A method of mounting a planar waveguide laser crystal, the method comprising:

providing a laser crystal mount comprising an upper housing, a lower housing coupled to the upper housing, and a cavity interposed therebetween, the cavity defined by at least a portion of interior horizontal surfaces of the upper and lower housings positioned opposite and facing each other;

positioning a thermal interface material on the interior horizontal surfaces of the upper and lower housings defining the cavity;

mounting the planar waveguide laser crystal in the cavity, the planar waveguide laser crystal comprising upper and lower cladding layers and a waveguide layer interposed therebetween, the mounting comprising positioning a laser crystal in the cavity with the upper and lower cladding layers sandwiched between respective interior horizontal surfaces of the upper and lower housings; and thermally coupling a heat dissipating structure to a horizontal exterior surface of at least one of the upper and lower housings to dissipate heat from the laser crystal mount.

13. The method of claim 12, further comprising, prior to mounting the planar waveguide laser crystal in the cavity, matching a coefficient of thermal expansion of material of the laser crystal mount with a coefficient of thermal expansion of the laser crystal.

14. The method of claim 13, wherein positioning the thermal interface material comprises integrating at least one of an indium foil gasket, an indium-silver foil gasket, and a thermal gap pad between the upper and lower cladding layers of the laser crystal and the interior horizontal surfaces of the upper and lower housings.

15. The method of claim 14, further wherein integrating the at least one of an indium foil gasket, an indium-silver foil gasket, and a thermal gap pad comprises:

die-cutting at least one of indium foil gasket, indium-silver foil gasket, and thermal gap pad pre-forms to a predetermined size to fit precisely between the cladding layers of the laser crystal and the interior horizontal surfaces of the upper and lower housings; and assembling the at least one of the indium foil gasket, indium-silver foil gasket, and thermal gap pad pre-forms between the cladding layers of the laser crystal and the interior horizontal surfaces of the upper and lower housings at room temperature.

16. The method of claim 14, wherein integrating the indium foil gasket or indium-silver foil gasket comprises at least one of (1) hot-pressing and oven-annealing, and (2) performing liquid indium or liquid indium-silver reflow between the cladding layers of the laser crystal and the interior horizontal surfaces of the upper and lower housings.

17. The method of claim 16, wherein integrating the indium foil gasket or indium-silver foil gasket further comprises, after the at least one of (1) hot-pressing and oven-annealing, and (2) performing liquid indium or liquid indium-silver reflow, fastening the upper and lower housings to each other with a predetermined torqueing pattern at a temperature below a melting point of the indium foil gasket to adequately clamp the indium foil gasket between the cladding layers of the laser crystal and the interior horizontal surfaces of the upper and lower housings.

18. The method of claim 12, wherein thermally coupling a heat dissipating structure comprises embedding in, or coupling the heat dissipating structure to at least one of the upper and lower housings of the laser crystal mount.

19. The method of claim 12, wherein the heat dissipating structure is selected from the group consisting of an embedded vapor chamber, an oscillating heat pipe, and an advanced heat spreader embedded in or coupled to the lower housing of the laser crystal mount.

* * * * *